US010805596B2

(12) United States Patent
Chinnock et al.

(10) Patent No.: US 10,805,596 B2
(45) Date of Patent: Oct. 13, 2020

(54) STEREOSCOPIC IMAGING SENSOR APPARATUS AND METHOD FOR FABRICATING PAIRS OF IMAGE SENSORS USED IN STEREOSCOPIC IMAGING

(71) Applicant: Titan Medical Inc., Toronto (CA)

(72) Inventors: Randal B. Chinnock, Ashford, CT (US); Jason P. Julian, Charlton, MA (US); George Grubner, Needham, MA (US); William L. Weber, Olivebridge, NY (US)

(73) Assignee: TITAN MEDICAL INC., Toronto (CA)

(*) Notice: Subject to any disclaimer, the term of this patent is extended or adjusted under 35 U.S.C. 154(b) by 0 days.

(21) Appl. No.: 16/060,905

(22) PCT Filed: Dec. 2, 2016

(86) PCT No.: PCT/CA2016/000300
§ 371 (c)(1),
(2) Date: Jun. 8, 2018

(87) PCT Pub. No.: WO2017/096455
PCT Pub. Date: Jun. 15, 2017

(65) Prior Publication Data
US 2019/0075283 A1    Mar. 7, 2019

Related U.S. Application Data

(60) Provisional application No. 62/265,021, filed on Dec. 9, 2015.

(51) Int. Cl.
*H04N 13/239*    (2018.01)
*H01L 27/146*    (2006.01)
(Continued)

(52) U.S. Cl.
CPC ..... *H04N 13/239* (2018.05); *H01L 27/14607* (2013.01); *H04N 5/2258* (2013.01);
(Continued)

(58) Field of Classification Search
None
See application file for complete search history.

(56) References Cited

U.S. PATENT DOCUMENTS 3,963,489 A * 6/1976 Cho .................. G03F 9/70
430/22
9,721,927 B1 * 8/2017 Or-Bach ............ H01L 23/544
(Continued)

FOREIGN PATENT DOCUMENTS

JP    2007-322128    12/2007
JP    2010-021283    1/2010
(Continued)

OTHER PUBLICATIONS

International Search Report received in PCT Application PCT/CA2016/000300, dated Feb. 22, 2017.
(Continued)

*Primary Examiner* — James M Hannett

(57) ABSTRACT

A stereoscopic image sensor apparatus including a pair of image sensors adjacently fabricated on a common carrier is disclosed, the common carrier being a diced portion of a carrier on which an aligned plurality of image sensors have been fabricated within an alignment tolerance, the alignment tolerance including a target lateral offset between the adjacent image sensors, and a target orientation between corresponding rows of light sensitive elements on the adjacent image sensors. An alternative stereoscopic image sensor apparatus includes a common window having first and second image sensors bonded to the common window within the alignment tolerance. Another alternative stereoscopic
(Continued)

image sensor apparatus includes rear faces of respective first and second image sensors being bonded to a common circuit substrate within the alignment tolerance. Methods for fabricating the stereoscopic image sensors are also disclosed.

32 Claims, 8 Drawing Sheets

(51) Int. Cl.
    *H04N 5/225*     (2006.01)
    *H04N 5/374*     (2011.01)

(52) U.S. Cl.
    CPC ....... *H04N 5/374* (2013.01); *H01L 27/14618* (2013.01); *H04N 2213/001* (2013.01)

(56) References Cited

U.S. PATENT DOCUMENTS

| | | |
|---|---|---|
| 2008/0001727 A1 | 1/2008 | Ohsumi et al. |
| 2010/0210088 A1* | 8/2010 | Ishimaru ................ G03F 9/708 438/401 |
| 2012/0050589 A1* | 3/2012 | Ueno .................... H04N 9/045 348/274 |
| 2012/0292484 A1 | 11/2012 | Cieslinski |
| 2013/0070055 A1 | 3/2013 | Atanassov et al. |
| 2014/0103476 A1 | 4/2014 | Jin et al. |
| 2014/0132739 A1 | 5/2014 | Ohsumi et al. |
| 2014/0138521 A1 | 5/2014 | Liu et al. |
| 2015/0029313 A1* | 1/2015 | Muller ................. H04N 13/246 348/47 |
| 2015/0054962 A1 | 2/2015 | Borthakur et al. |
| 2016/0219203 A1* | 7/2016 | Wan ..................... H04N 5/2257 |
| 2017/0075226 A1* | 3/2017 | Nagler ............. G03G 15/04072 |
| 2018/0031372 A1* | 2/2018 | Gill .......................... G01C 3/14 |
| 2018/0054605 A1 | 2/2018 | Grubner et al. |

FOREIGN PATENT DOCUMENTS

| | | |
|---|---|---|
| JP | 2011-123078 | 6/2011 |
| JP | 2012-049257 | 3/2012 |
| JP | 2013-174784 | 9/2013 |
| WO | WO 2014/146629 | 9/2014 |
| WO | WO 2015/149046 | 10/2015 |

OTHER PUBLICATIONS

Written Opinion received in PCT Application PCT/CA2016/000300, dated Feb. 22, 2017.
U.S. Appl. No. 15/754,566, filed Feb. 22, 2018, Chinnock et al.

* cited by examiner

STEREOSCOPIC IMAGING SENSOR APPARATUS AND METHOD FOR FABRICATING PAIRS OF IMAGE SENSORS USED IN STEREOSCOPIC IMAGING

CROSS-REFERENCE TO RELATED APPLICATION

This application is a U.S. National Phase Application under 35 U.S.C. 371 of International Application No. PCT/CA2016/000300 filed on Dec. 2, 2016 and published as WO 2017/096455 A1 on Jun. 15, 2017, which claims priority to U.S. Provisional Application No. 62/265,021, filed on Dec. 9, 2015. The entire disclosures of all of the above applications are incorporated herein by reference.

BACKGROUND

1. Field

This disclosure relates generally to fabricating pairs of image sensors used in stereoscopic imaging.

2. Description of Related Art

In stereoscopic imaging systems, pairs of two-dimensional images may be captured from slightly different perspectives using a stereoscopic camera. Displaying the right image to a user's right eye and the left image to the user's left eye provides a three-dimensional view that mimics human vision. The three-dimensional display provides additional depth perception over a two-dimensional image.

Stereoscopic cameras may be used in many applications and may be useful when working within an enclosed space, such as for example, performing laparoscopic surgery within a human or animal body cavity. Compact stereoscopic cameras typically have a small difference in perspective between the left and right images, but still provide a useful level of three-dimensional perception.

SUMMARY

In accordance with one disclosed aspect there is provided a method for fabricating pairs of image sensors used in stereoscopic imaging, each image sensor having a plurality of light sensitive elements arranged in rows and columns on a front face of the image sensor. The method involves fabricating an aligned plurality of image sensors on a carrier, the plurality of image sensors being disposed on the carrier within an alignment tolerance, the alignment tolerance including a target lateral offset between adjacent image sensors, and a target orientation between corresponding rows of light sensitive elements on adjacent image sensors. The method also involves dicing the carrier to separate image sensors in the aligned plurality of image sensors into diced pairs of image sensors, each diced pair of image sensors disposed on common portion of the diced carrier.

The method may further involve, for each diced pair of image sensors bonding a common window over the front faces of the diced pair of image sensors, the window being spaced apart from the front faces of the diced pair of image sensors by a spacer having openings disposed to permit light to reach the respective front faces.

Fabricating the aligned plurality of image sensors may further involve bonding a window extending over the front faces of the plurality of image sensors, the window being spaced apart from the front faces of the plurality image sensors by a spacer having openings disposed to permit light to reach the respective front faces, and dicing the carrier may involve dicing the carrier, the spacer, and the window into diced pairs of image sensors having a common window extending across the respective front faces.

Fabricating the aligned plurality of image sensors may involve, for each image sensor in the plurality of image sensors, forming one or more alignment indicia on the respective front faces, the indicia being operable to facilitate subsequent alignment of optical elements to the image sensors.

The target orientation between corresponding rows of light sensitive elements on adjacent image sensors in the plurality of image sensors may involve at least one of a target collinearity between corresponding rows of light sensitive elements on adjacent image sensors, and a target co-planarity between front faces of adjacent image sensors in the plurality of image sensors.

Each image sensor in the plurality of image sensors may include a plurality of sensor mounting pads on a rear face of the image sensor and the method may further involve bonding the sensor mounting pads on the respective rear faces of the diced pairs of image sensors to connect the sensors to conductors in an electrical circuit.

In accordance with another disclosed aspect there is provided a stereoscopic image sensor apparatus including a pair of image sensors adjacently fabricated on a common carrier, the common carrier being a diced portion of a carrier on which an aligned plurality of image sensors have been fabricated within an alignment tolerance, the alignment tolerance including a target lateral offset between the adjacent image sensors, and a target orientation between corresponding rows of light sensitive elements on the adjacent image sensors.

Each pair of image sensors may include a spacer bonded over front faces of the pair of image sensors, and a common window bonded to the spacer, the spacer having openings disposed to permit light received through the window to reach the respective front faces of each of the pair of sensors.

The common window may include a diced portion of a window extending over the front faces of the aligned plurality of image sensors.

The target orientation between corresponding rows of light sensitive elements on adjacent image sensors in the plurality of image sensors may include at least one of a target collinearity between corresponding rows of light sensitive elements on adjacent image sensors, and a target co-planarity between front faces of adjacent image sensors in the plurality of image sensors.

Each of the pair of image sensors in the plurality of image sensors may include a plurality of sensor mounting pads on a rear face of the image sensor operable to facilitate connection of the sensors to conductors in an electrical circuit.

In accordance with another disclosed aspect there is provided a method for adjacently mounting first and second image sensors used in stereoscopic imaging, each image sensor having a plurality of light sensitive elements arranged in rows and columns on a front face of the image sensor. The method involves causing relative movement of at least one of the first and second image sensors to align the image sensors within an alignment tolerance, the alignment tolerance including a target lateral offset between the first and second sensors, and a target orientation between corresponding rows of light sensitive elements on the first and second image sensors. The method also involves bonding the first and second image sensors to a common window when the first and second image sensors are aligned within the alignment tolerance.

Each of the first and second image sensors include a spacer disposed about a periphery of the front face, the spacer having an opening disposed to permit light to reach the respective front faces, and bonding the first and second image sensors to the common window may involve bonding the spacer to the common window.

Bonding the first and second image sensors to the common window may involve bonding one or more spacers to the window, the one or more spacers having openings disposed to permit light to reach the respective front faces of the first and second image sensors, and bonding the one or more spacers to the first and second image sensors.

Each of the first and second image sensors may include a spacer disposed about a periphery of the front face and a sensor window bonded to the spacer, the spacer having an opening disposed to permit light to reach the front face, and bonding the first and second image sensors to the common window may involve bonding the respective sensor windows to the common window.

The target orientation between corresponding rows of light sensitive elements on the first and second image sensors may involve at least one of a target collinearity between corresponding rows of light sensitive elements on the first and second image sensors, and a target co-planarity between front faces of the first and second image sensors.

Each of the first and second image sensors may include a plurality of sensor mounting pads on a rear face of the image sensor and the method may further involve bonding the sensor mounting pads on the respective rear faces of the first and second image sensors to a common carrier.

In accordance with another disclosed aspect there is provided a stereoscopic image sensor apparatus. The apparatus includes a common window, and first and second image sensors each having a plurality of light sensitive elements arranged in rows and columns on a front face of the image sensor, the first and second image sensors being bonded to the common window within an alignment tolerance, the alignment tolerance including a target lateral offset between the first and second sensors, and a target orientation between corresponding rows of light sensitive elements on the first and second image sensors.

The apparatus may include one or more spacers bonded between a periphery of the front faces of the image sensors and the common window, the one or more spacers having respective openings disposed to permit light to reach the respective front faces.

The target orientation between corresponding rows of light sensitive elements on the first and second image sensors may include at least one of a target collinearity between corresponding rows of light sensitive elements on the first and second image sensors, and a target co-planarity between front faces of the first and second image sensors.

Each of the pair of image sensors in the plurality of image sensors may include a plurality of sensor mounting pads on a rear face of the image sensor operable to facilitate connection of the sensors to conductors in an electrical circuit.

In accordance with another disclosed aspect there is provided a stereoscopic image sensor apparatus. The apparatus includes first and second image sensors each having a plurality of light sensitive elements arranged in rows and columns on a front face of the image sensor and a plurality of sensor mounting pads on a rear face of the image sensor, the rear faces of the respective first and second image sensors being bonded to a common circuit substrate within an alignment tolerance including a target lateral offset between the first and second sensors, and a target orientation between corresponding rows of light sensitive elements on the first and second image sensors.

The apparatus may include an alignment frame having reference features operable to position the first and second image sensors within the alignment tolerance.

The apparatus may include a common window bonded over the front faces of the pair of image sensors, the window being operable to cause the front faces of the first and second image sensors to be disposed within target co-planarity, the window being spaced apart from the front faces of the pair of image sensors by a spacer having openings disposed to permit light to reach the respective front faces.

Each of the pair of image sensors may include a spacer disposed about a periphery of the front face and a sensor window bonded to the spacer, the spacer having an opening disposed to permit light to reach the front face, and the sensor windows of the first and second image sensors may be bonded to the common window.

The apparatus may include an alignment frame having reference features being operable to position the first and second image sensors within an alignment tolerance, the sensors being disposed in engagement with the reference features.

In accordance with another disclosed aspect there is provided a method for adjacently mounting first and second image sensors used in stereoscopic imaging, each image sensor having a plurality of light sensitive elements arranged in rows and columns on a front face and a plurality of sensor mounting pads on a rear face of the image sensor. The method involves disposing each of the first and second image sensors in engagement with reference features of an alignment frame, the reference features being operable to position the first and second image sensors within an alignment tolerance, the alignment tolerance including a target lateral offset between the first and second image sensors, and a target orientation between corresponding rows of light sensitive elements on the first and second image sensors. The method also involves bonding the sensor mounting pads on the respective rear faces of the first and second image sensors to a common circuit substrate while the first and second image sensors are held within the alignment tolerance by the alignment frame.

The method may involve removing the alignment frame following bonding the sensor mounting pads to the common circuit substrate.

The reference features of the alignment frame may be operable to position the first and second image sensors within the target lateral offset and within a target collinearity between corresponding rows of light sensitive elements on adjacent sensors and the method may further involve bonding a common window over the front faces of the pair of image sensors prior to bonding the sensor mounting pads on the respective rear faces of the first and second image sensors to the common circuit substrate, the common window being operable to cause the front faces of the first and second image sensors to be disposed within target co-planarity, the common window being spaced apart from the front faces of the pair of image sensors by one or more spacers having respective openings disposed to permit light to reach the respective front faces.

The reference features of the alignment frame may be operable to position the first and second image sensors within the target lateral offset, within a target collinearity between corresponding rows of light sensitive elements on adjacent sensors, and within a target co-planarity.

The method may involve bonding a common window over the front faces of the pair of image sensors subsequent to bonding the sensor mounting pads to the common circuit substrate.

The alignment frame may include first surfaces defining the reference features for positioning the first and second image sensors within the target lateral offset and the target collinearity and second surfaces for positioning the front faces of the first and second image sensors within the target co-planarity.

The alignment frame may include a frame body having a recess, the recess having surfaces defining the reference features for positioning the first and second image sensors within the target lateral offset and the target collinearity, the frame body may further include a planar surface for positioning the front faces of the first and second image sensors within the target co-planarity.

The alignment frame may include a plurality of springs operable to urge the first and second image sensors into engagement with the reference features.

The common circuit substrate may have mounting pads corresponding to the sensor mounting pads, the mounting pads may involve metal and bonding the sensor mounting pads to the common circuit substrate may involve causing a melted fusible metal to flow between the sensor mounting pads and circuit substrate mounting pads, the fusible metal being operable to provide a bond between the sensor mounting pads and circuit substrate mounting pads when cooled below a melting point of the fusible metal.

At least a portion of the sensor mounting pads may be electrically connected to the image sensor and the common circuit substrate may include an electrical circuit operable to connect signals to and from the first and second image sensors via the circuit substrate mounting pads, the fusible material, and the sensor mounting pads.

Other aspects and features will become apparent to those ordinarily skilled in the art upon review of the following description of specific disclosed embodiments in conjunction with the accompanying figures.

BRIEF DESCRIPTION OF THE DRAWINGS

In drawings which illustrate disclosed embodiments.

DETAILED DESCRIPTION

Figure 1:
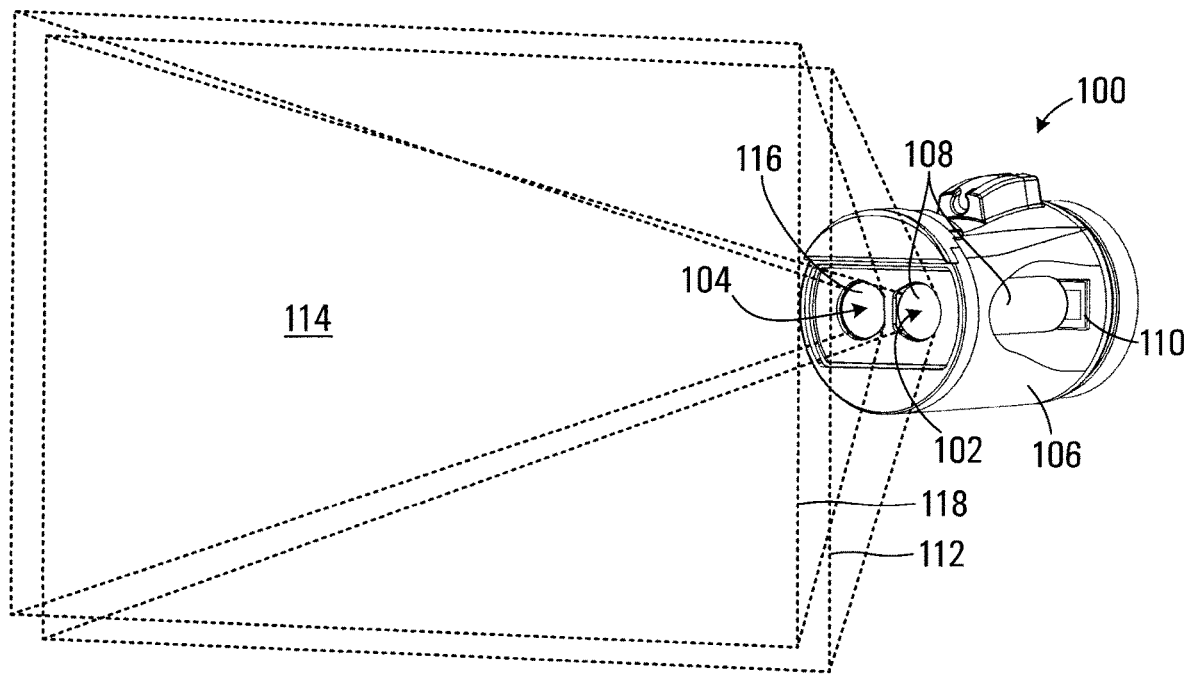
FIG. 1 is a perspective view of a stereoscopic camera.

Referring to FIG. 1, a stereoscopic camera apparatus is shown generally at 100. The stereoscopic camera 100 includes two spaced apart imagers including an imager 102 and an imager 104 enclosed within a housing 106. The imager 102 includes a lens assembly 108 and a first image sensor 110 disposed to receive light captured from a first perspective viewport 112 within an object field 114. The lens assembly 108 may include a plurality of lens elements (not shown). The imager 104 includes a lens assembly 116 and a second image sensor disposed to receive light captured from a second perspective viewport 118 within the object field 114 (the image sensor associated with the second imager 104 is obscured in the view shown in FIG. 1).

The imager 102 receives light from the object field 114 through the lens assembly 108 and images the light onto the first image sensor 110 to capture an image from a first perspective viewpoint corresponding to the first perspective viewport 112. The first image sensor 110 generates data signals representing the light energy received at light sensitive elements on the sensor. Similarly, the lens assembly 116 of the second imager 104 captures an image from the second perspective viewpoint associated with the second perspective viewport 118 and the corresponding second image sensor (not shown in FIG. 1) generates data signals representing the image. The data signals from the imagers 102 and 104 are provided as outputs from the stereoscopic camera 100 and may be processed to display an image that conveys three-dimensional (3D) spatial information associated with the object field 114 to the viewer. For example the images may be separately presented to a user's left and right eyes to mimic human vision.

Figure 2:
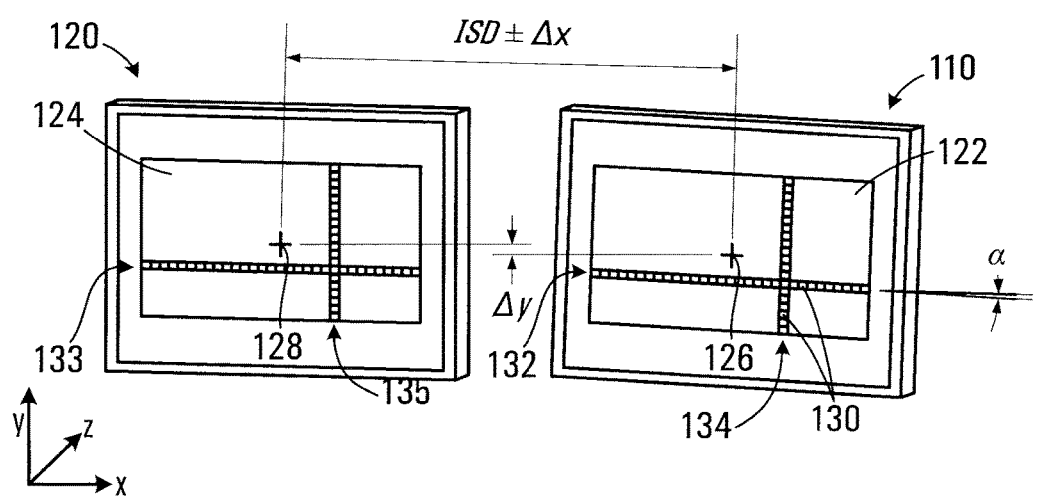
FIG. 2 is a perspective view of the first and second image sensors used in the stereoscopic camera shown in FIG. 1.

Referring to FIG. 2, the first image sensor 110 is shown in conjunction with a second image sensor 120. The image sensors 110 and 120 each have respective active areas 122 and 124 having respective center points 126 and 128. The active areas 122 and 124 each include a plurality of light sensitive elements or pixels 130 disposed in rows 132, 133 and columns 134, 135. In FIG. 2, the individual light sensitive elements 130 are shown enlarged for sake of illustration and in practice may have dimensions of only a few micrometers (for example 3 μm×3 μm). The sensors 110 and 120 may have a pixel count of several million pixels. The sensors 110 and 120 are laterally offset with respect to each other such that the center points 126 and 128 are spaced apart by an inter-sensor distance ISD in the x-axis direction. The inter-sensor distance ISD is selected to provide sufficient perspective difference between the first perspective viewport 112 and the second perspective viewport 118. In general the size of the housing 106 may place a constraint on the inter-sensor distance, which would generally be selected to be as close as possible to an average separation between a human's eyes within the space constraints associated with the particular application.

It is advantageous to have the rows 132 and 133 of light sensitive elements precisely aligned within a tight tolerance between the first and second sensors 110 and 120 (typically in the micrometer region). Sufficiently precise alignment reduces the amount of processing of the data signals generated by each of the image sensors 110 and 120 for displaying and/or extracting 3D information. When the image sensors 110 and 120 and their respective lenses are precisely aligned, points in each of the individual 2D images of a planar object at a preselected nominal distance captured by the imagers 102 and 104 will have a substantially zero image pair disparity across a plane in the object field 114. In this case any residual image disparity would be primarily a function of object distance departure from the plane in the object field 114.

In the embodiment shown in FIG. 2, the rows 132 and 133 of light sensitive elements of the first and second sensors 110 and 120 are shown separated by a distance Δy in a y-axis direction. The first image sensor 110 is also tilted with respect to the second image sensor 120 such that the rows 132 and 133 are at an angle α. In general it would be desirable that the rows 132 and 133 be aligned collinear within a collinearity tolerance expressed in terms of the distance ΔY, an angle α. The lateral offset of the sensors 110 and 120 ISD should also be within a tolerance Δx. In one embodiment the alignment tolerances may be selected to align pixels over substantially the entire field of view of the sensors to an accuracy commensurate with a desired resolution of the stereoscopic camera 100. Resolution generally depends on image quality, the F-number, pixel size, and other imaging parameters. Additionally, the active areas 122 and 124 should also be substantially coplanar in the x-y plane to such that the image sensors share a substantially common focal plane, and keystone distortion and magnification matching issues are minimized.

In general alignment of the imagers 102 and 104 requires optical and mechanical adjustments in several degrees of freedom for each of the image sensors 110 and 120 and the respective lenses 108 and 116. Some mechanical and optical adjustments may also be interrelated and require an alignment strategy to avoid subsequent adjustments affecting previous adjustments or to compensate for other errors and aberrations that may cause performance problems, such as lens alignment for example.

In some embodiments it may be desirable that the first perspective viewport 112 and second perspective viewport 118 precisely overlap so that a common object point in a plane within the object field 114 would be imaged by both cameras with point-to-point correspondence. Points on three-dimensional objects departing from the nominal plane within the object field 114 would then have a disparity between the 2D images due to the different perspective points of the two cameras, thus providing a 3D effect when displayed using a stereoscopic display. In one embodiment the image sensors 110 and 120 and respective lenses 108 and 116 may be offset or aligned such that the first perspective viewport 112 and second perspective viewport 118 are precisely overlapped within a tight tolerance Δx. In one embodiment this alignment may involve moving the lenses 108 and 116 slightly off-axis toward each other (along the x direction) with respect to the center points 126 and 128 of the active areas 122 and 124 to achieve overlap between the first and second perspective viewports 112 and 118. Common points within 2D images of the nominal plane within the object field 114 will thus be located at the same pixel row and column for each of the pair of images and the data signals representing the images thus need not be further processed to match up differing viewports prior to providing the signals to the respective stereoscopic displays. Any significant disparity between the perspective viewports 112 and 118 may necessitate processing of the data signals representing the images, such as removal of rotation between 2D images, which adds to undesired latency between acquisition and display of images. In many systems where display of 3D images provides live video feedback to an operator, latency may be problematic and reduce the effectiveness of the imaging system.

Figure 3:
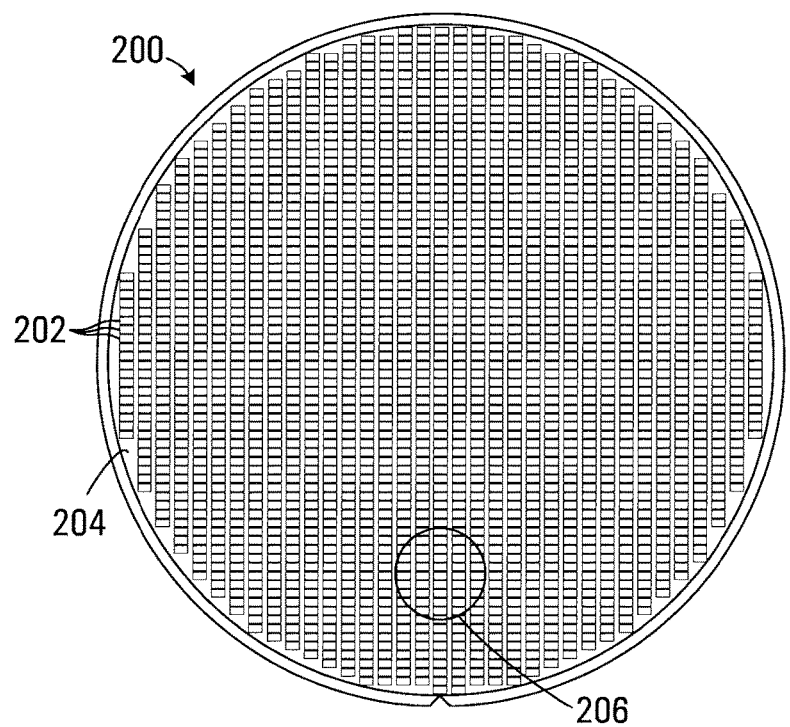
FIG. 3 is a plan view of a CMOS wafer including a plurality of image sensors.

The image sensors 110 and 120 may be CMOS active pixel sensor devices, which are typically fabricated in large numbers on a semiconductor wafer using microlithographic technologies. Alternatively, charge coupled device (CCD) image sensors may be used in some applications. Referring to FIG. 3, a typical 300 mm CMOS wafer including a plurality of image sensors is shown in plan view generally at 200. The wafer 200 includes a large plurality of individual image sensors 202 on a carrier 204. Fabrication may initially start out on a wafer substrate such as silicon on insulator (SOI) or other conventional silicon substrate, which may be later largely removed to expose light activated areas of the image sensors. The carrier 204 thus may not be the original silicon substrate and may be bonded to the wafer prior to removal of the original silicon substrate. Electrical connections are then formed on the rear side of the carrier 204. In some embodiments the electrical connections may take the form of a plurality of ball grid array pads formed on the rear of the wafer 200 providing for subsequent surface mounting of the sensor. The electrical connections provide for connecting signals and power between the sensor and conductors on an electrical circuit substrate such as a printed circuit board or a flexible interconnect circuit, for example.

In some manufacturing processes, further optical layers may be added to bare image sensors in a wafer level packaging (WLP) process. For example, an anti-reflection (AR) coating may be applied over the front faces of the sensors 202 and an optical-quality glass window may be bonded over the sensors to protect the active areas from damage and contamination. The window will generally be spaced apart from the front faces of the sensors by a spacer between the window and the wafer. In some embodiments a microlens array having microlens elements for each light sensitive element on the sensor may be aligned and bonded to the sensors prior to bonding the window over the sensor. The wafers are then diced into individual sensors, which following the WLP process provides individual image sensors that are generally ready for use and require no additional processing steps. In other non-WLP processes bare AR coated sensors may be diced into individual sensors prior to the bonding of the spacer/window and/or microlens arrays to the front faces.

Figure 4:
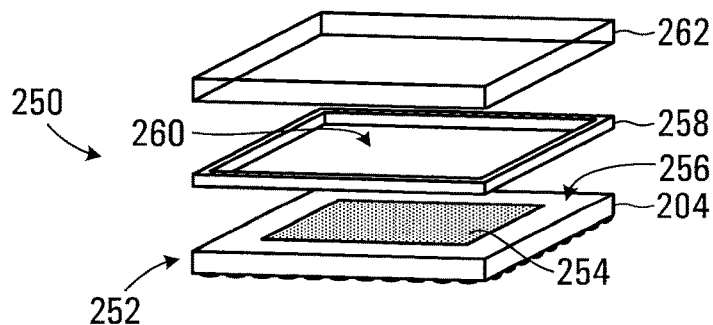
FIG. 4 is an exploded perspective view of an image sensor assembly.
Figure 5:
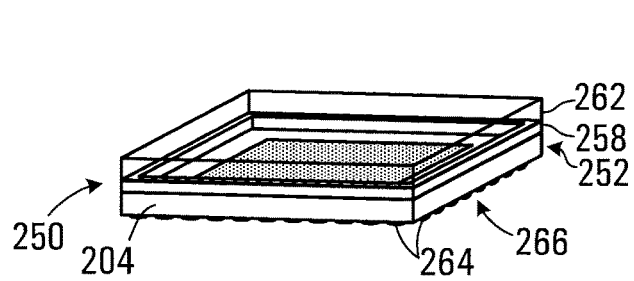
FIG. 5 is a perspective view of an assembled image sensor of FIG. 4.
Figure 6:
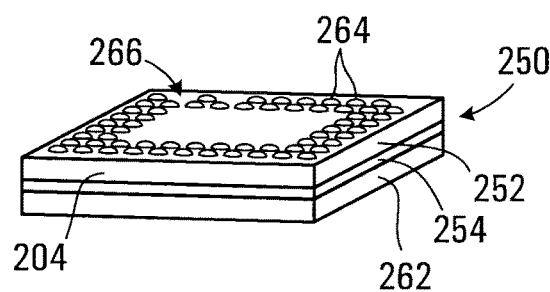
FIG. 6 is a rear perspective view of the assembled image sensor shown in FIG. 5.

Referring to FIG. 4, an exploded view of an individual image sensor is shown at 250. The image sensor 250 includes a bare sensor assembly 252 having an active area 254 spaced inwardly on a front face 256 of the carrier 204 that facilitates mounting of a spacer 258. The spacer 258 includes an opening 260 disposed to permit light to reach the respective active area 254. The image sensor 250 also includes an optical quality window 262, which is bonded to the spacer 258 to produce the assembled image sensor 250 as shown in FIG. 5. The active area 254 is protected by the window 262 from ingress of dust or other contaminants. The image sensor 250 also includes a plurality of electrical connections 264 formed on a rear face 266 of the carrier 204. Referring to FIG. 6, the image sensor 250 is shown with the rear face 266 oriented upwardly to reveal the plurality of electrical connections 264, which in this embodiment are provided as a ball grid array of pads.

The individual image sensor 250 shown in FIGS. 4-6 may be fabricated in a WLP process where the inclusion of the spacer 258 and window 262 is performed at a wafer-level before the individual sensors are diced along the spacers to separate the sensors. Alternatively, in a non-WLP process the bare sensor 252 may be fabricated at a wafer level and then diced into individual bare sensors 252. Following dicing, the spacer 258 and window 262 may be individually bonded to each bare sensor to produce the image sensor 250.

Figure 7:
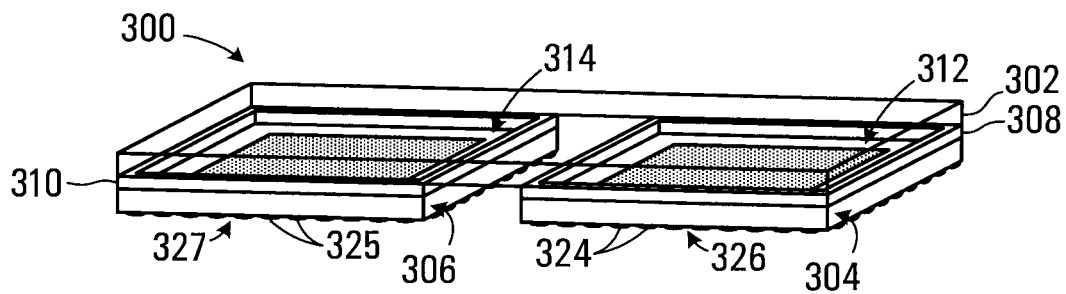
FIG. 7 is a stereoscopic image sensor apparatus in accordance with one disclosed embodiment.

Referring to FIG. 7, a stereoscopic image sensor apparatus in accordance with one embodiment is shown generally at 300. The stereoscopic image sensor 300 includes a common window 302, which may be fabricated from a substantially planar uniform thickness optical quality glass having high transmittance and low surface reflectivity of light over a wavelength range of the sensor and/or an illuminating light source. The stereoscopic image sensor 300 also includes a first image sensor 304 and a second image sensor 306 bonded to the common window 302. The material of the common window 302 may be selected to have a thermal expansion coefficient that is similar to a thermal expansion coefficient for the sensors 304 and 306 to reduce thermally induced shear forces when operating at different environmental temperatures. The common window 302 is thus shared by both the first image sensor 304 and the second image sensor 306.

The first image sensor 304 and second image sensor 306 each include light sensitive elements arranged in rows and columns on the respective front faces of the image sensors as shown in FIG. 2. The first and second image sensors 304 and 306 are bonded to the common window 302 within an alignment tolerance. The alignment tolerance involves spacing the sensors 304 and 306 apart by the target inter-sensor distance ISD and a target collinearity between corresponding rows of light sensitive elements on the first and second image sensors. Additionally the window 262 may be selected to provide a planarity sufficient to cause the front faces 312 and 314 of the sensors 304 and 306 to be oriented within a target co-planarity when bonded to the window.

In the embodiment shown each of the first and second image sensors 304 and 306 have respective spacers 308 and 310 disposed between the front faces 312 and 314 and the window 302. The window 302 thus protects the active areas on the front faces 312 and 314 of the sensors 304 and 306 from contamination due to dust or handling during assembly. In this embodiment the sensors 304 and 306 in FIG. 7 each include ball grid electrical connections 324 and 325 on respective rear faces 326 and 327 of the sensors. In other embodiments the sensors 304 and 306 may be configured for electrical connection via other types of surface mounting or non-surface mounting techniques.

Figure 8:
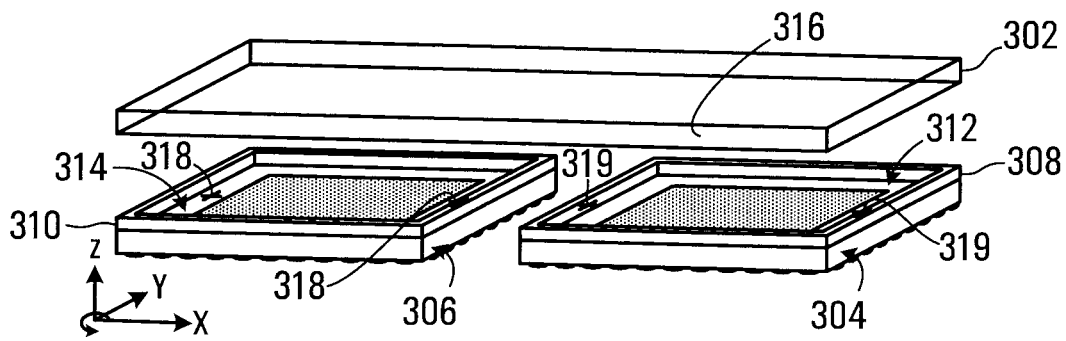
FIG. 8 is an exploded perspective view of the stereoscopic image sensor shown in FIG. 7 in accordance with one disclosed embodiment.

An exploded perspective view of the stereoscopic image sensor 300 in accordance with one disclosed embodiment is shown in FIG. 8. Referring to FIG. 8, in this embodiment the sensors 304 and 306 are fabricated with the spacers 308 and 310 included on the front faces 312 and 314 of the sensors and then diced. The spacers 308 and 310 of the respective sensors are then subsequently bonded to the window 302.

Figure 9:
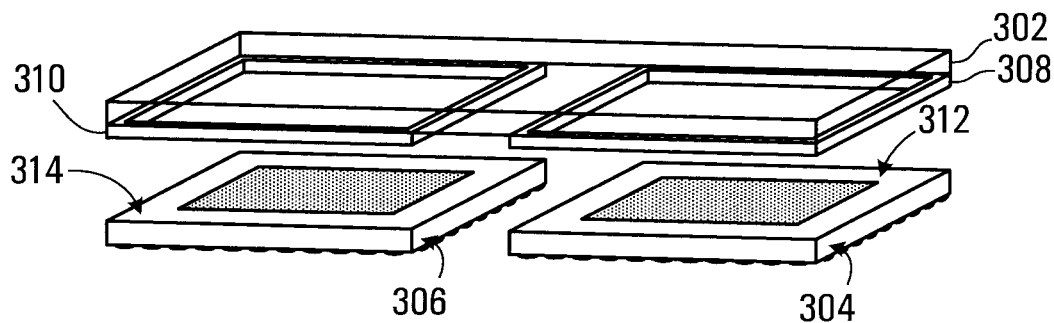
FIG. 9 is an exploded perspective view of the stereoscopic image sensor shown in FIG. 7 in accordance with another disclosed embodiment.

Referring to FIG. 9, the sensors 304 and 306 may alternatively be fabricated as a plurality of bare sensors on the wafer and then diced into individual bare sensors. Individual spacers 308 and 310 may be bonded to the common window 302 to form a window assembly. The window assembly may then be bonded to the front faces 312 and 314 of the sensors 304 and 306.

Figure 10:
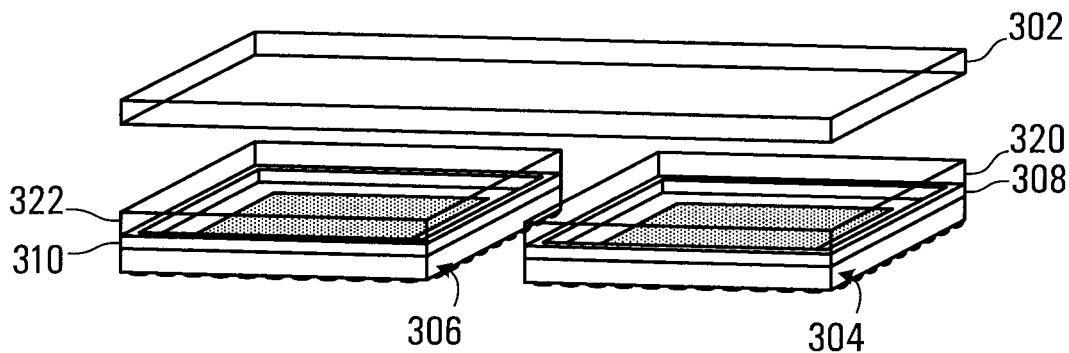
FIG. 10 is an exploded perspective view of a stereoscopic image sensor in accordance with a another disclosed embodiment.

Referring to FIG. 10, in another embodiment the sensors 304 and 306 may be fabricated in a WLP process to include both the spacers 308 and 310 and respective sensor windows 320 and 322. In a subsequent assembly process the sensor windows 320 and 322 may be bonded to the common window 302 using an optically transparent adhesive between the windows. This embodiment provides the possibility of using standard packaged off-the-shelf sensors as would be made available by the manufacturer for incorporation in OEM equipment. The embodiments shown in FIGS. 8 and 9 have the advantage of omitting the additional sensor windows 320 and 322, but require use of a bare sensor in the case of the FIG. 9 embodiment or a partially packaged sensor having spacers 308 and 310 in the case of the FIG. 8 embodiment.

Figure 11:
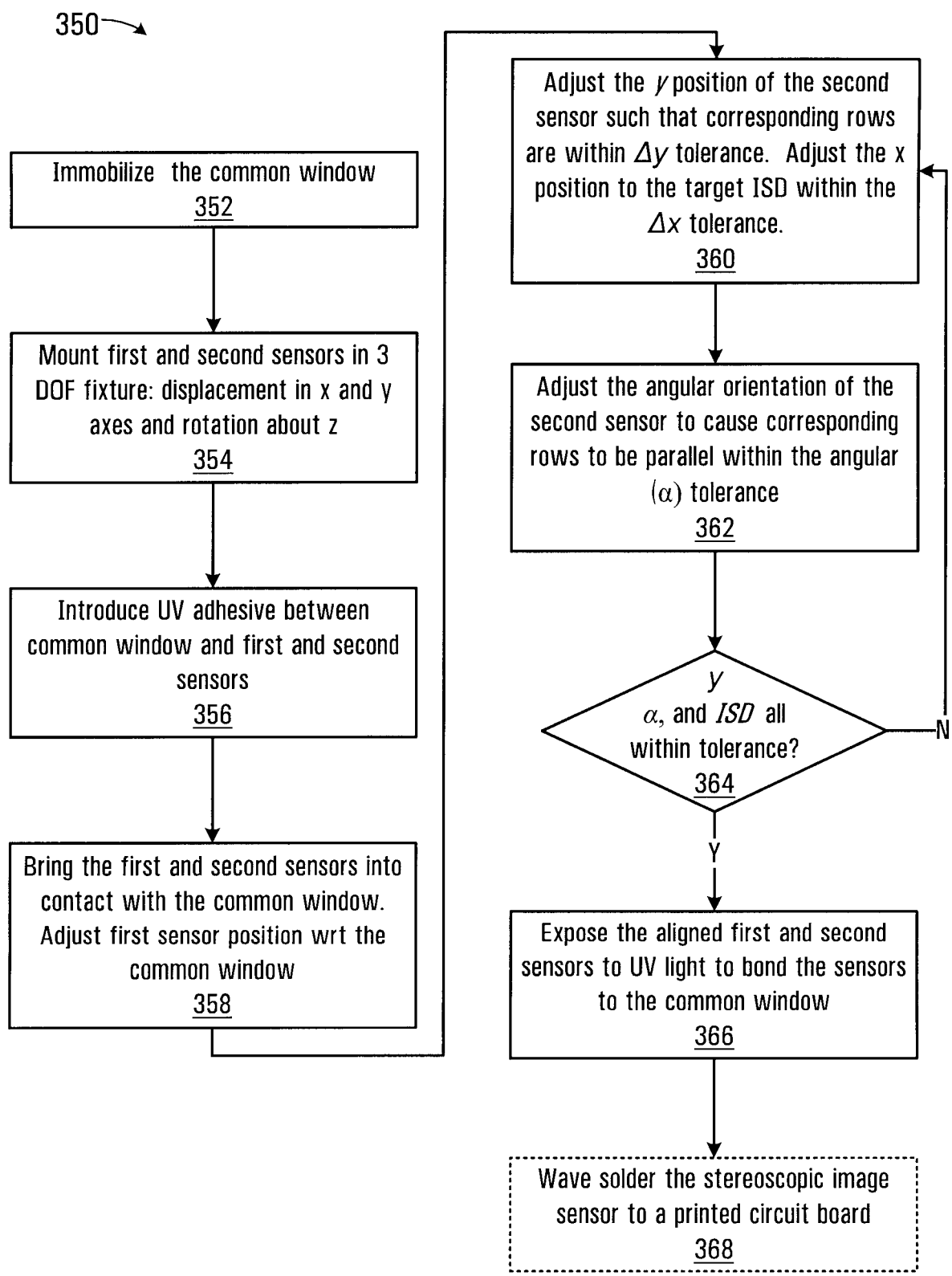
FIG. 11 is a flowchart depicting a process for aligning and bonding a pair of image sensors to a common window.

Referring to FIG. 11, a process flowchart for aligning and bonding the first image sensor 304 and second image sensor 306 to the common window 302 as shown in FIG. 7 to FIG. 10 is shown generally at 350. As shown at 352 the sensor window 320 is first immobilized, which in one embodiment may involve receiving the window in a fixture that holds the window securely in place without causing significant distortion due to mounting forces.

The common window 302 has a surface that is optically flat (typically in a sub-μm range) and thus provides a planar reference surface for mounting the sensors 304 and 306. At 354, either one or both of the first sensor 304 and the second sensor 306 are mounted within jigs that provide for movement in three degrees of freedom. Referring to FIG. 8, in one embodiment the three degrees of freedom include displacement of each of the sensors along the x-axis, displacement of each of the sensors along the y-axis and rotation of each of the sensors about the z-axis.

The process 350 then continues at 356, where a UV curable adhesive is introduced between the first and second sensors 304 and 306 and the common window 302. At 358 the first image sensor 304 and second image sensor 306 are brought into contact with the common window 302 such that the active areas on the front faces 312 and 314 will be substantially co-planar due to the engagement with the planar reference surface of the common window 302. At this time the position of the first sensor 304 with respect to the common window 302 may also be adjusted so that edges of the sensor are positioned substantially in alignment with common window and the rows of light sensitive elements on the sensor are generally parallel to the longer edge 316 of the window. Tolerances for sensor location with respect to the edge of the common window 302 are generally not as critical as the alignment between sensors, and a precise adjustment of the first sensor may not be required in this respect.

As shown at 360, the process 350 then continues with adjustment of the second sensor to line up corresponding rows of light sensitive elements along the x-axis to meet the target collinearity tolerance. In one embodiment, a plurality of fiducial markers 318 and 319 (shown in FIG. 8) are incorporated during the microlithographic fabrication process on the respective front faces 312 and 314 of the first and second sensors 304 and 306. The fiducial markers 318 and 319 may be located with high precision relative to a centrally located row of light sensitive elements on each of the sensors, for example. As an example, a traveling microscope having a precision travel axis and scale aligned with the x-axis of the first and second sensor fixtures may be used to center one of the fiducial markers 318 on the first sensor 304. The traveling microscope may then be moved over the corresponding fiducial marker 319 on the second sensor 306, and the fixture associated with the second sensor used to bring the fiducial marker into alignment with the traveling microscope axis, thus setting $\Delta y \approx 0$. Similarly, the inter-sensor distance ISD may be set in the x-axis by moving the second sensor 306 to place the fiducial markers 318 and 319 at a desired x-axis offset indicated by the traveling microscope scale, thus setting $\Delta x \approx 0$. The travelling microscope may also be used to verify co-planarity. In other embodiments alternative opto-mechanical alignment and measurement instruments may be used to align to the fiducial markers 318 and 319.

In other embodiments the fiducial markers 318 and 319 may be omitted and the traveling microscope or other instrument may use selected light sensitive elements within the active areas of the sensors or other features on the sensor as fiduciary markers. In many small format CMOS image sensors the pixels are small (for example 3 µm by 3 µm) and should facilitate sub-micron alignment accuracy.

The process continues at 362, where the angular orientation of the second sensor 306 is then adjusted using the plurality of fiducial markers 318 and 319 to set the pixel rows to be parallel within the target angular tolerance α. At 364, a further measurement is made using the traveling microscope or other instrument to determine whether both the y and ISD positions are within the respective $\Delta y$ and α tolerances and the ISD is within the $\Delta x$ tolerance. Generally, changes to angular orientation may have an effect on the y position and possibly the ISD and the separate adjustments may need to be made on an iterative basis until all of the tolerances are met at 364. If at 364, the position and orientation of the first and second sensors 304 and 306 are within the tolerances, the process continues at 366, where the first and second sensors 304 and 306 are exposed to UV radiation to cure the UV adhesive and to secure the aligned sensors in place on the window 302.

The resulting stereoscopic image sensor assembly 300 (shown in FIG. 7) is thus pre-aligned and may be incorporated into the stereoscopic camera 100 shown in FIG. 1 without requiring any further sensor-to-sensor adjustment. Remaining optical alignments such as alignment of the lens assemblies 108 and 116 to the respective first and second image sensors may be performed at the time of camera assembly. In one embodiment, optical alignment may involve aligning an optical axis associated with each of the lens assemblies 108 and 116 to the respective center points (i.e. the points 126 shown in FIG. 2) of the sensor active area. Alternatively, as described above the optical axes of the lens assemblies 108 and 116 may be intentionally offset to cause the first perspective viewport 112 and the second perspective viewport 118 to substantially overlap at the nominal plane within the object field 114 (FIG. 1).

Embodiments that rely on bonding of the first image sensor 304 and second image sensor 306 to the common window plate 302 have the advantage of easily facilitating changes to the target inter-sensor distance ISD at an image sensor sub-assembly level, allowing for lower precision manufacturing processes and/or compensation of other camera misalignments. Additionally, in stereoscopic imaging any variation in thickness between window portions overlaying the active area of the first and second sensors 304 and 306 may cause the sensors to have slightly differing imaging characteristics. For the embodiments shown in FIGS. 8 and 9 the common window 302 of optical quality would have a substantially uniform thickness and the effect of the window on imaging performance will thus be substantially identical. For the embodiment shown in FIG. 10, the common window 302 would not cause any significant differences in imaging characteristics over and above any inherent difference due to use of separate and possibly differing sensor windows 320 and 322 for the two sensors. The optical design for the lens assemblies 108 and 116 may however need to take the additional window thickness into account.

Figure 12:
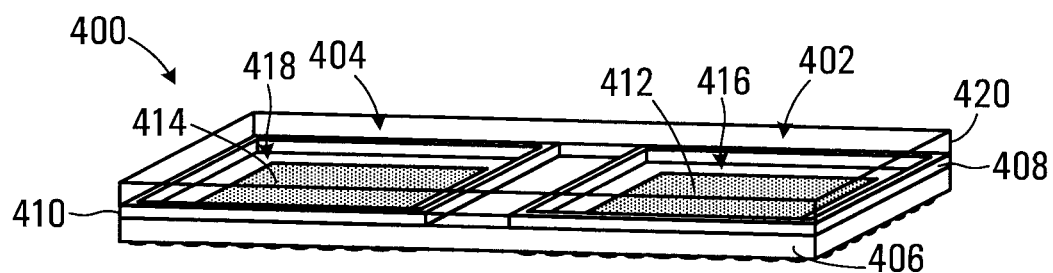
FIG. 12 is a stereoscopic image sensor apparatus on a common carrier in accordance with another disclosed embodiment.

Referring to FIG. 12, a stereoscopic image sensor apparatus in accordance with an alternative embodiment is shown generally at 400. The stereoscopic image sensor 400 includes a pair of image sensors 402 and 404 adjacently fabricated on a common carrier 406. In the embodiment shown the image sensor 402 has a spacer 408 surrounding an active area 412 on a front face 416 of the sensor and the image sensor 404 has a spacer 410 surrounding an active area 414 on a front face 418 of the sensor. A common window 420 is bonded to the spacers 408 and 410 and covers the front faces 416 and 418 of the sensors 402 and 404.

Figure 13:
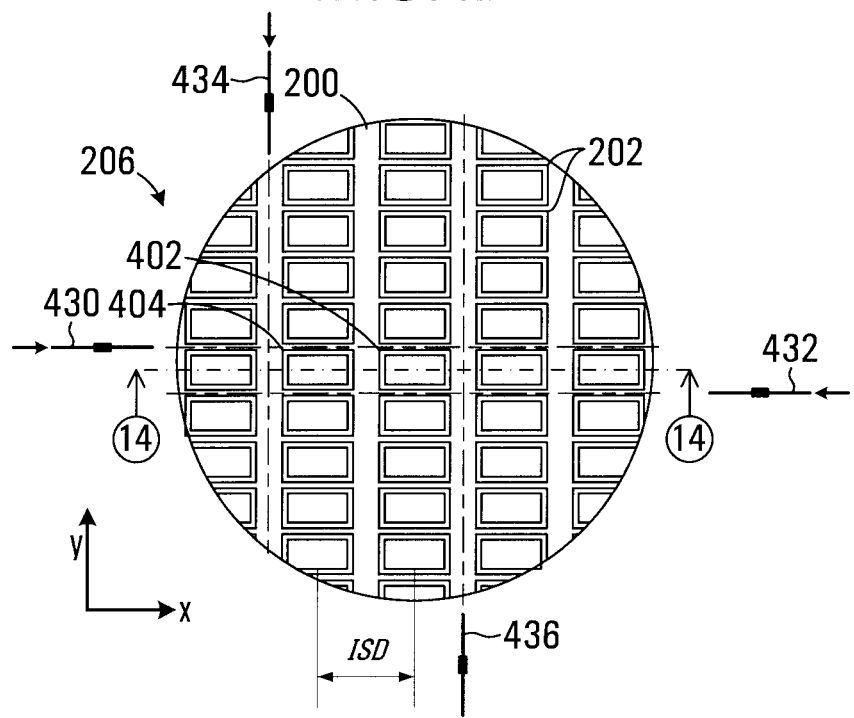
FIG. 13 is an enlarged portion of the CMOS wafer shown in FIG. 3.

An enlarged portion 206 of the wafer 200 shown in FIG. 3 is shown in FIG. 13. The common carrier 406 is a diced portion of the carrier 204 on which the aligned plurality of image sensors 202 have been fabricated. Referring to FIG. 13, the sensors 202 on the wafer will be disposed within an alignment tolerance provided by microlithographic technologies used during the fabrication process. Alignment between sensors will typically be in the sub-micron range commensurate with a linewidth of lithographic processes used in the fabrication process, which may be typically less than about 0.1 µm. The sensors 202 on the wafer 200 may thus be fabricated within an alignment tolerance including a target lateral offset between the adjacent image sensors and a target collinearity between corresponding rows of light sensitive elements on adjacent image sensors. Further WLP integration could include the spacer layer and a full window plate over the entire wafer.

In the embodiment shown in FIG. 13, individual sensors 202 are shown closely spaced apart in the y axis direction, but in the x-axis direction the spacing between adjacent sensors is expanded such that the distance between sensors corresponds to a selected inter-sensor distance ISD. In this embodiment, dicing the wafer 200 along the x-axis would proceed as usual in wafer fabrication. However, rather than dicing the wafer 200 along the y-axis direction into individual sensors 202, the sensors are separated into adjacent paired sensors, such as the sensors shown at 402 and 404 in FIG. 13. Exemplary dicing cuts for pairing the sensors 202 are illustrated by schematically represented dicing blades 430, 432, 434 and 436. The dicing may cut the spacer and window at the same time the sensors are separated into paired sensors.

Figure 14:
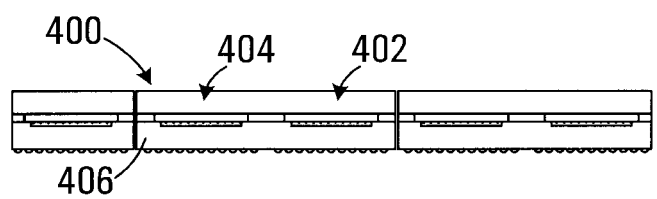
FIG. 14 is a cross sectional view of the CMOS wafer shown in FIG. 13 taken along the line 14-14 following dicing cuts.

Referring to FIG. 14, the diced sensors are shown in cross section following dicing cuts 430 and 432 in the x-axis direction and dicing cuts 434 and 436 in the y-axis direction, which separate the sensors 402 and 404 on the diced portion 406 of the carrier 200. The x-axis and y-axis direction dicing may be performed in any order. In an alternative embodiment the wafer 200 may have sensors 202 laid out in pairs with reduced spacing between adjacent pairs to permit more sensors to be fabricated on the wafer. Alternatively, the wafer may be fabricated with only portion of the plurality of sensors being arranged in pairs such that each wafer yields both paired sensors and individual sensors.

In some embodiments the WLP processing may further involve bonding a microlens array over the sensors 202 at the wafer processing stage. The microlens array may include individual lenses for each light sensitive element on the active area and may be fabricated using microlithographic techniques to a tolerance commensurate with the fabrication tolerances inherent in the wafer fabrication.

Figure 15:
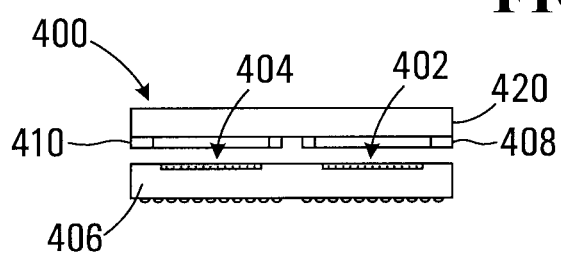
FIG. 15 is a cross sectional view depicting an alternative assembly process for the stereoscopic image sensor embodiment shown in FIG. 12.
Figure 16:
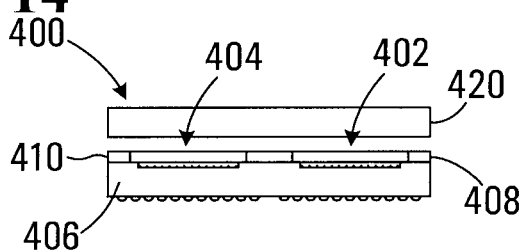
FIG. 16 is a cross sectional view depicting another assembly process for the stereoscopic image sensor embodiment shown in FIG. 12.

Referring to FIG. 15, in an alternative embodiment the wafer may be fabricated as a pair of bare sensors 402 and 404 on the common carrier 406 and a separate window 420 and spacers 408 and 410 may be bonded to the sensors after dicing the wafer into the sensor pairs. Referring to FIG. 16, in another embodiment the spacers 408 and 410 may be fabricated on the wafer 200 prior to dicing, and the window 420 may be bonded to the spacers for each diced sensor pair.

As in the case of the embodiments shown in FIGS. 8 and 9, the stereoscopic image sensor 400 shown in FIG. 12 will have a substantially uniform thickness for the portions of the common window 420 covering each of the pair of image sensors 402 and 404. The common carrier 406 and the common window 420 together ensure that the front faces 416 and 418 of the sensors 402 and 404 are substantially co-planar.

Figure 17:
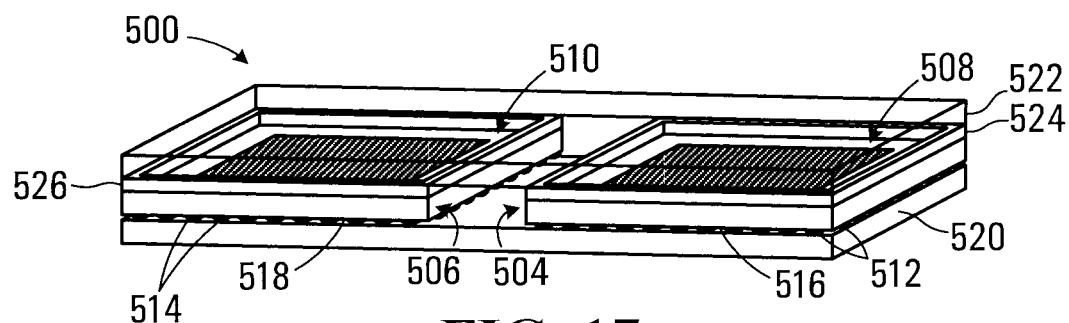
FIG. 17 is a perspective view of a stereoscopic image sensor on a circuit substrate in accordance with another disclosed embodiment.

Referring to FIG. 17, a stereoscopic image sensor in accordance with another disclosed embodiment is shown generally at 500. The stereoscopic image sensor 500 includes a first image sensor 504 and a second image sensor 506. The image sensors 504 and 506 each have a plurality of light sensitive elements arranged in rows and columns on respective front faces 508 and 510 of the image sensors as described above in connection with FIG. 2. The sensors 504 and 506 each include a plurality of electrical mounting pads 512 and 514 on respective rear faces 516 and 518 of the image sensors. The mounting pads 512 and 514 of the respective first and second image sensors 504 and 506 are bonded to a common circuit substrate 520 within an alignment tolerance. The alignment tolerance includes a target lateral offset ISD between the first and second sensors 504 and 506 and a target orientation between corresponding rows of light sensitive elements on the first and second image sensors. The common circuit substrate 520 may be a printed circuit board that facilitates both mounting of the sensors 504 and 506 and electrical connection to the sensors.

In the embodiment shown in FIG. 17, the stereoscopic image sensor 500 includes a common window 522 and spacers 524 and 526 bonded over the front faces of the pair of image sensors 504 and 506. The common window 522 is optically flat and causes the front faces of the first and second image sensors to be disposed within target co-planarity when bonded or urged into contact with the window.

Figure 18:
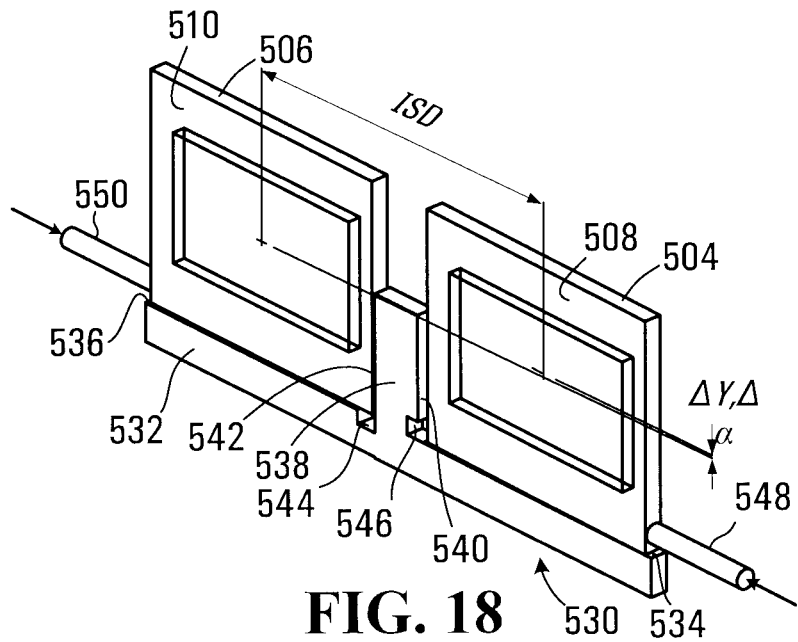
FIG. 18 is a perspective schematic view of an alignment frame for aligning a pair of image sensors used in the stereoscopic image sensor shown in FIG. 17.

Referring to FIG. 18, an alignment frame for aligning the sensors 504 and 506 is shown at 530. The alignment frame 530 includes a base 532 having surfaces 534 and 536 that act as reference features for locating the sensors such that corresponding rows are aligned collinearly within the angular $\alpha$ and $\Delta y$ tolerance. The alignment frame 530 also includes a center spacer 538 having surfaces 540 and 542 that act as reference features for spacing the sensors 504 and 506 at the desired inter-sensor distance ISD. A cutout 544 in the surface 536 and a cutout 546 in the surface 540 remove material from corners that may reduce alignment accuracy by preventing precise engagement of the surfaces by the sensors. The alignment frame 530 further includes a pin 548 that may be pushed toward the center spacer 538 to cause the sensor 504 to engage the reference surface 540 and a pin 550 that may be pushed toward the center spacer 538 to cause the sensor 506 to engage the reference surface 542. The alignment frame 530 may be fabricated from a metallic material and the reference surfaces 534, 536, 540 and 542 may be precision ground to provide for accurate alignment of the of the sensors 504 and 506. Other pins (not shown) may be used in the y-direction to urge the sensors 504 and 506 against the reference surfaces 534 and 536.

Figure 19:
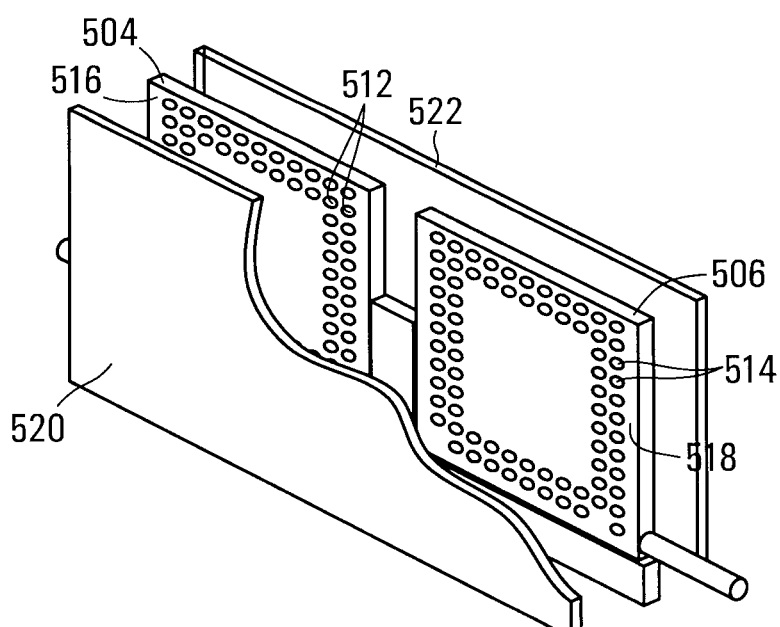
FIG. 19 is an exploded rear perspective view of the alignment frame shown in FIG. 18.

The rear of the alignment frame 530 and the rear faces 516 and 518 of the sensors 504 and 506 are shown in FIG. 19. Referring to FIG. 19, the sensor mounting pads 512 and 514 are exposed and are proud of the alignment frame 530, which permits bonding to the circuit substrate 520 during a solder process. In this case the plurality of sensor mounting pads 512 and 514 are ball grid electrical connections and the solder process may be a wave solder process or a reflow solder process. A fusible material such as a solder paste is applied between the plurality of sensor mounting pads 512 and 514 and corresponding pads on the circuit substrate 520 for temporarily attaching the sensors 504 and 506 to the circuit substrate. The solder paste permits lateral motion of the sensors 504 and 506 to register edges of the sensors to the reference surfaces 534 and 536 following which the pins 548 and 550 are depressed toward the center spacer 538 to cause the sensors to engage the reference surfaces 540 and 542. Under these conditions the sensors 504 and 506 will be aligned to the alignment frame 530 and the common window 522 may be bonded to the spacers 524 and 526 on sensors 504 and 506 to cause the front faces 508 and 510 to be aligned co-planar to each other. Processes that rely on engagement of reference surfaces of an alignment frame require that edges of the sensors that engage the references be precisely located with respect to rows and columns of the light sensitive elements.

The stereoscopic image sensor 500 including the bonded common window 522, alignment frame 530, and sensors are then subjected to a reflow solder process where a heat cycle is applied to cause the fusible metal to melt and flow between the sensor mounting pads and PCB mounting pads. The fusible metal is thus operable to provide a bond between the sensor mounting pads 512 and 514 and the PCB mounting pads when cooled below a melting point of the fusible metal. In the embodiment shown in FIG. 17, the alignment frame 530 is subsequently removed. However in other embodiments the alignment frame 530 may be left in place as part of the sensor assembly 500.

The reference features of the alignment frame 530 thus facilitate positioning of the first and second image sensors 504 and 506 within the target lateral offset, the target collinearity between corresponding rows of light sensitive elements, and within a target co-planarity of the respective front faces 508 and 510. In this embodiment the reference features of the alignment frame 530 are implemented as surfaces, but in other embodiments other reference features may be used such as pins or spherical balls. In embodiments that require tight alignment tolerances, the soldering may cause unacceptable distortions and in such cases it may be preferable to first bond the sensors to a common window as described above.

Figure 20:
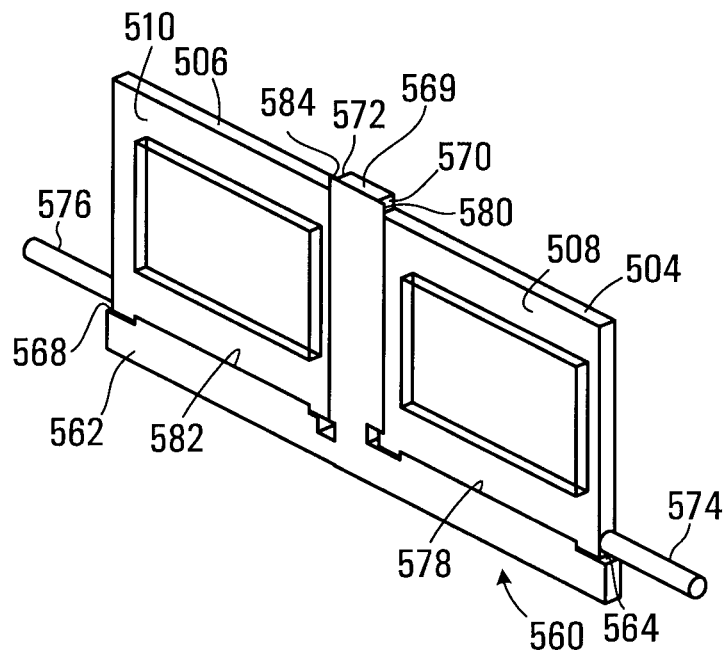
FIG. 20 is a perspective view of an alternative alignment frame for aligning a pair of image sensors used in the stereoscopic image sensor shown in FIG. 17.

An alternative embodiment of an alignment frame for aligning the sensors 504 and 506 (shown in FIG. 17) is shown at 560 in FIG. 20. Referring to FIG. 20, as described above in connection with the alignment frame 530, the alignment frame 560 includes a base 562 having reference surfaces 564 and 568 that act as reference features for locating the sensors 504 and 506 such that corresponding rows on the sensors are aligned within the α and y tolerances. The alignment frame 560 also includes a center spacer 569 having surfaces 570 and 572 that act as reference features for spacing the sensors 504 and 506 by the desired inter-sensor distance ISD. The alignment frame 560 further includes pins 574 and 576 for urging the sensors toward the surfaces 570 and 572 on the center spacer 569. Other pins may be used in the y direction to urge the sensors 504 and 506 against reference surfaces 564 and 568.

The alignment frame 560 additionally includes reference surfaces 578 and 580 defined by the alignment frame 560 that together provide a planar reference for aligning the planarity of the sensor 504. The alignment frame 560 also includes reference surfaces 582 and 584 defined by the alignment frame 560 that are co-planar with the surfaces 578 and 580. The reference surfaces 578, 580, 582, and 584 are located behind the outward facing surface of the alignment frame 560 in FIG. 20. The reference surfaces 582 and 584 together provide a reference plane for aligning the planarity of the sensor 506 such that the front faces 508 and 510 of the sensors are co-planar. The sensors 504 and 506 would be urged against reference surfaces 578, 580, 582 and 584 by holding forces provided by pins or other means to assure co-planarity of the sensors.

Figure 21:
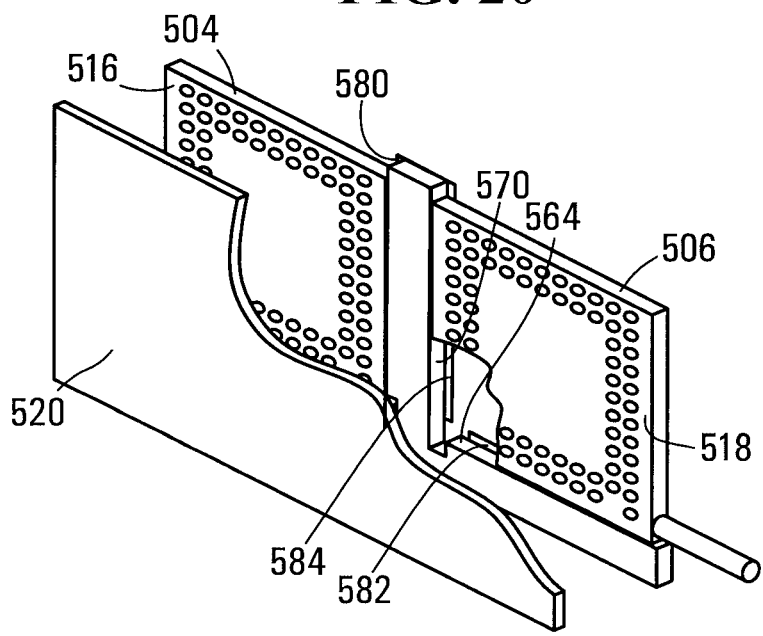
FIG. 21 is an exploded rear perspective view of the alignment frame shown in FIG. 20.

A rear of the alignment frame 560 and the rear faces 516 and 518 of the sensors 504 and 506 are shown in FIG. 21. The sensor 506 is shown partially cut away to reveal the reference surfaces 564 and 570 that provide for lateral alignment of the sensor 506 and the reference surfaces 582 and 584 that provide for co-planar alignment of the sensors 504 and 506. In the embodiment shown in FIGS. 20 and 21, a common window is not required since the alignment frame 560 provides for the co-planarity of the sensors 504 and 506. In one embodiment the sensors 504 and 506 may be implemented using an off-the-shelf WLP packaged sensor having an integrated window, such as the image sensor 250 shown in FIG. 5.

As described above in connection with FIG. 18, once the sensors 504 and 506 are aligned within the alignment frame 560 the rear faces 516 and 518 of the sensors may be soldered to a printed circuit board to fix the sensors in aligned relation to each other. The alignment frame 560 may then be removed. Alternatively, the sensors 506 and 508 may be bonded to the frame 560 using an adhesive prior to soldering, and the frame may remain part of the image sensor assembly 500.

Figure 22:
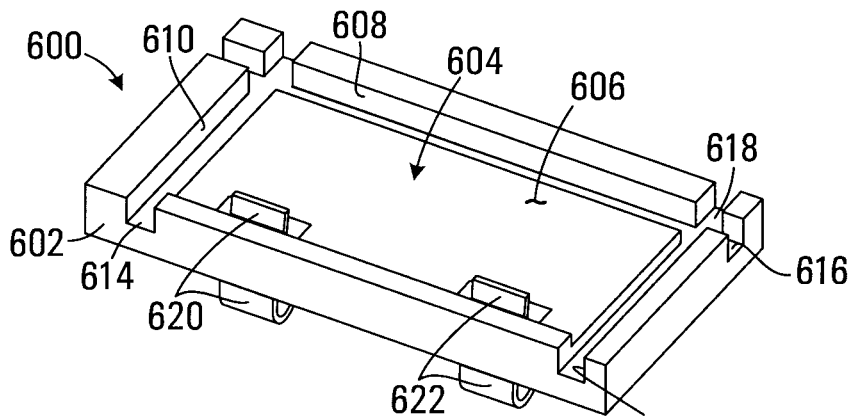
FIG. 22 is a perspective view of a further embodiment of an alignment frame.
Figure 23:
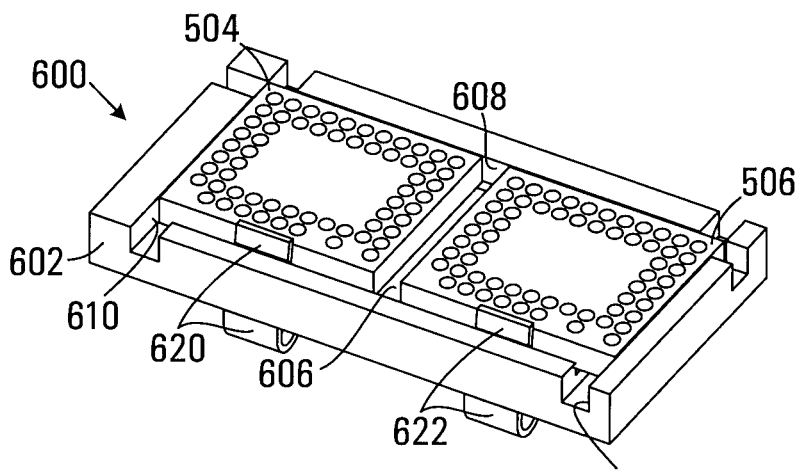
FIG. 23 is a perspective view of the alignment frame shown in FIG. 22 loaded with a pair of image sensors.

Another embodiment of an alignment frame for aligning the sensors 504 and 506 (shown in FIG. 17) is shown at 600 in FIGS. 22 and 23. The alignment frame 600 includes a frame body 602 having a recess 604 and a plurality of surfaces defining reference features for positioning the first and second image sensors within the target lateral offset, collinearity and co-planarity. The recess 604 includes a reference surface 606 for establishing co-planarity between the sensors 504 and 506. The reference surface 606 may be ground to be a substantially planar surface for engaging the front faces 508 and 510 of the sensors 504 and 506 shown in FIG. 17 and the sensors are placed face-down in the recess 604. Alternatively, if the sensors have an integrated sensor window, such as shown in FIG. 5, co-planarity may be established through careful engagement of the window with the reference surface 606.

The recess 604 also includes a reference surface 608 for establishing co-linearity between corresponding rows of light sensitive elements on the sensors 504 and 506. The recess 604 further includes reference surfaces 610 and 612 for establishing the target lateral offset of the sensors 504 and 506. Cutouts 614, 616, and 618 may be provided to remove material from corners that may engage edges of the sensors causing alignment inaccuracies. The alignment frame 600 also includes springs 620 and 622 for urging each of the sensors 504 and 506 into contact with the reference surface 608 and securing the sensors within the recess 604. Additional springs (not shown) may be provided for urging the sensors 504 and 506 into engagement with the reference surfaces 606, 610 and 612.

Figure 24:
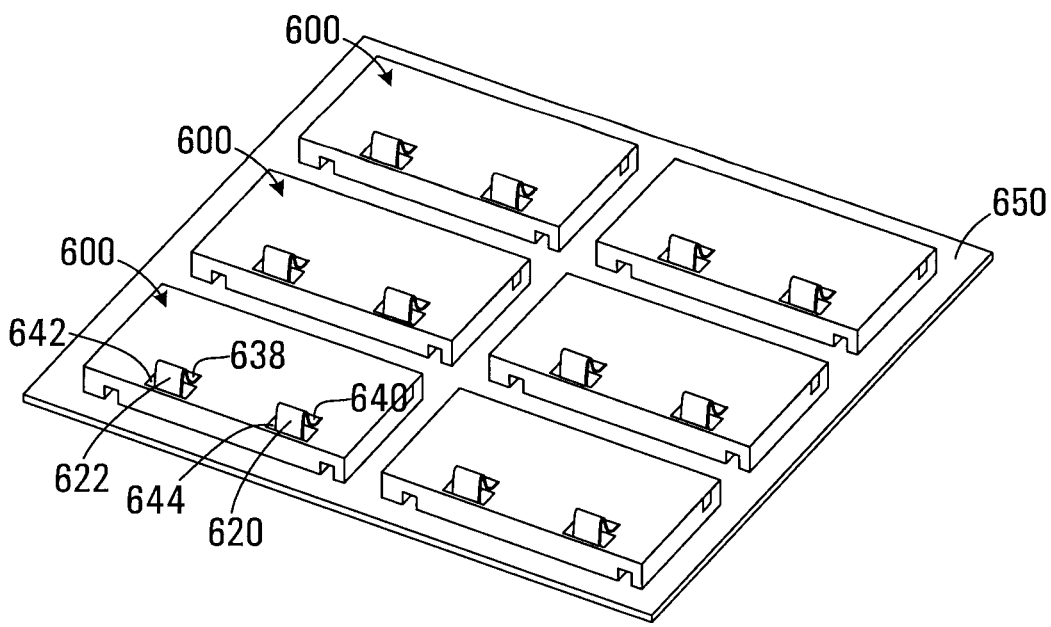
FIG. 24 is a rear perspective view of a plurality of the alignment frames shown in FIG. 23 on a circuit substrate.

Referring to FIG. 24, a plurality of the alignment frames 600 are shown from a rear perspective. The springs 620 and 622 include flat portions 638 and 640 attached to the rear of the base 602 and project through slots 642 and 644. In the embodiment shown in FIG. 24, the plurality of alignment frames 600 have been be loaded with pairs of sensors and then placed into contact with a printed circuit substrate 650 in preparation for reflow soldering. The printed circuit substrate 650 may be subsequently diced to separate the pairs of sensors.

The above disclosed embodiments permit pre-alignment of a pair of sensors within a target collinearity, co-planarity and spaced at a target inter-sensor distance with respect to each other. The aligned sensors may be subsequently integrated into stereoscopic cameras such as shown at 100 in FIG. 1. The camera need only provide for subsequent alignment of the sensors as an aligned pair reducing mounting complexity and hardware within the housing 106.

While specific embodiments have been described and illustrated, such embodiments should be considered illustrative of the invention only and not as limiting the invention as construed in accordance with the accompanying claims.

What is claimed is:
1. A stereoscopic imaging sensor apparatus comprising:
 a first image sensor comprising a first front face having a first active area, the first active area comprising a first plurality of light sensitive elements positioned along a first plurality of rows and columns;
 a second image sensor positioned adjacent to the first image sensor on a common carrier and comprising a second front face having a second active area, the second active area comprising a second plurality of light sensitive elements positioned along a second plurality of rows and columns;
 a first spacer mounted on the first front face of the first image sensor, the second spacer having a first opening disposed through the first spacer and configured to permit light to reach the first active area;
 a second spacer mounted on the second front face of the second image sensor, the second spacer having a second opening disposed through the second spacer and configured to permit light to reach the second active area; and a common window mounted on the first spacer and the second spacer, the common window being spaced from and extending over both the first front face and the second front face such that the common window is configured to protect the first active area and the second active area from contaminants, wherein the first active area and the second active area are substantially coplanar such that the first active area and the second active area share a substantially common focal plane, and wherein the common carrier comprises a diced portion of a carrier on which the first image sensor is aligned relative to the second image sensors within an alignment tolerance, and wherein the alignment tolerance comprises:
- a target lateral offset between the first image sensor and the second image sensor; and
- a target orientation within the common focal plane between each of the plurality of rows of the first plurality of light sensitive elements and each of the corresponding rows of the plurality of rows of the second plurality of light sensitive elements.

2. The apparatus of claim 1 wherein the common window comprises a diced portion of a window extending over the front face of the first image sensor and the front face of the second image sensor.

3. The apparatus of claim 1 wherein the target orientation comprises a target collinearity between each of the rows of the first plurality of light sensitive elements and each of the corresponding rows of the second plurality of light sensitive elements.

4. The apparatus of claim 1, wherein each of the first image sensor and the second image sensor comprises a plurality of sensor mounting pads on a rear face of the respective image sensor, wherein the plurality of sensor mounting pads are configured to facilitate connection of the respective image sensor to conductors in an electrical circuit.

5. The apparatus of claim 1, wherein the alignment tolerance is less than about 0.1 μm.

6. The apparatus of claim 1, wherein the common window is shared by both the first image sensor and the second image sensor.

7. The apparatus of claim 1, wherein the common window comprises a thermal expansion coefficient that is similar to a thermal expansion coefficient of each of the first image sensor and the second image sensor.

8. The apparatus of claim 1, wherein the common window has a substantially planar uniform thickness.

9. The apparatus of claim 1, wherein the first plurality of light sensitive elements comprises a first plurality of pixels, and wherein the second plurality of light sensitive elements comprises a second plurality of pixels.

10. The apparatus of claim 1, wherein the first image sensor and the second image sensor each comprises one of a CMOS image sensor and a charge coupled device image sensor.

11. The apparatus of claim 1, wherein the first image sensor and the second image sensor are each bare image sensors.

12. The apparatus of claim 1 further comprising:
a first lens assembly configured to receive light captured from a first perspective viewport of an object field; and
a second lens assembly configured to receive light captured from a second perspective viewport of the object field,
wherein light captured by the first lens assembly is imaged onto the first plurality of light sensitive elements, and wherein light captured by the second lens assembly is imaged onto the second plurality of light sensitive elements.

13. The apparatus of claim 12, wherein a first optical axis of the first lens assembly is offset relative to a second optical axis of the second lens assembly such that the first perspective viewport aligns with the second perspective viewport.

14. The apparatus of claim 12, wherein the first image sensor is configured to output first data signals corresponding to light captured by the first lens assembly, wherein the second image sensor is configured to output second data signals corresponding to light captured by the second lens assembly, and wherein the first data signals and the second data signals are configured to be processed to display an image that conveys three-dimensional spatial information associated with the object field.

15. A carrier comprising a plurality of the stereoscopic imaging sensor apparatus of claim 12.

16. A carrier comprising a plurality of the stereoscopic imaging sensor apparatus of claim 1.

17. A stereoscopic imaging sensor apparatus comprising:
a first image sensor comprising a first front face having a first active area, the first active area comprising a first plurality of light sensitive elements positioned along a first plurality of rows and columns;
a second image sensor positioned adjacent to the first image sensor on a common carrier and comprising a second front face having a second active area, the second active area comprising a second plurality of light sensitive elements positioned along a second plurality of rows and columns;
a spacer mounted on the first front face of the first image sensor and the second front face of the second image sensor, the spacer having an opening disposed through the spacer and configured to permit light to reach at least one of the first active area and second active area; and
a common window mounted on the spacer, the common window being spaced from and extending over both the first front face and the second front face such that the common window is configured to protect the first active area and the second active area from contaminants,
wherein the first active area and the second active area are substantially coplanar such that the first active area and the second active area share a substantially common focal plane, and
wherein the common carrier comprises a diced portion of a carrier on which the first image sensor is aligned relative to the second image sensor within an alignment tolerance, and wherein the alignment tolerance comprises:
- a target lateral offset between the first image sensor and the second image sensor; and
- a target orientation within the common focal plane between each of the plurality of rows of the first plurality of light sensitive elements and each of the corresponding rows of the plurality of rows of the second plurality of light sensitive elements.

18. The apparatus of claim 17 wherein the common window comprises a diced portion of a window extending over the front face of the first image sensor and the front face of the second image sensor.

19. The apparatus of claim 17 wherein the target orientation comprises a target collinearity between each of the rows of the first plurality of light sensitive elements and each of the corresponding rows of the second plurality of light sensitive elements.

20. The apparatus of claim 17, wherein each of the first image sensor and the second image sensor comprises a plurality of sensor mounting pads on a rear face of the respective image sensor, wherein the plurality of sensor mounting pads are configured to facilitate connection of the respective image sensor to conductors in an electrical circuit.

21. The apparatus of claim 17, wherein the alignment tolerance is less than about 0.1 p.m.

22. The apparatus of claim 17, wherein the common window is shared by both the first image sensor and the second image sensor.

23. The apparatus of claim 17, wherein the common window comprises a thermal expansion coefficient that is similar to a thermal expansion coefficient of each of the first image sensor and the second image sensor.

24. The apparatus of claim 17 wherein the common window has a substantially planar uniform thickness.

25. The apparatus of claim 17, wherein the first plurality of light sensitive elements comprises a first plurality of pixels, and wherein the second plurality of light sensitive elements comprises a second plurality of pixels.

26. The apparatus of claim 17, wherein the first image sensor and the second image sensor each comprises one of a CMOS image sensor and a charge coupled device image sensor.

27. The apparatus of claim 17, wherein the first image sensor and the second image sensor are each bare image sensors.

28. The apparatus of claim 17 further comprising:
a first lens assembly configured to receive light captured from a first perspective viewport of an object field; and
a second lens assembly configured to receive light captured from a second perspective viewport of the object field,
wherein light captured by the first lens assembly is imaged onto the first plurality of light sensitive elements, and wherein light captured by the second lens assembly is imaged onto the second plurality of light sensitive elements.

29. The apparatus of claim 28, wherein a first optical axis of the first lens assembly is offset relative to a second optical axis of the second lens assembly such that the first perspective viewport aligns with the second perspective viewport.

30. The apparatus of claim 28, wherein the first image sensor is configured to output first data signals corresponding to light captured by the first lens assembly, wherein the second image sensor is configured to output second data signals corresponding to light captured by the second lens assembly, and wherein the first data signals and the second data signals are configured to be processed to display an image that conveys three-dimensional spatial information associated with the object field.

31. A carrier comprising a plurality of the stereoscopic imaging sensor apparatus of claim 28.

32. A carrier comprising a plurality of the stereoscopic imaging sensor apparatus of claim 17.

* * * * *